US004001792B2

United States Statutory Invention Registration [19]

[11] Reg. Number: H1792

Moran et al. [45] Published: Apr. 6, 1999

[54] SELECTION OF CRYSTAL ORIENTATION IN DIAMOND FILM CHEMICAL VAPOR DEPOSITION

[75] Inventors: Mark B. Moran; Linda F. Johnson, both of Ridgecrest, Calif.; Karl A. Klemm, Largo, Fla.

[73] Assignee: The United States of America as represented by the Secretary of the Navy, Washington, D.C.

[21] Appl. No.: 919,095

[22] Filed: Jul. 14, 1997

[51] Int. Cl.[6] ..... C23C 16/00

[52] U.S. Cl. ..... 427/249

[58] Field of Search ..... 427/249, 577, 427/575, 122; 423/446

[56] References Cited

U.S. PATENT DOCUMENTS 4,985,227 1/1991 Ito et al. .

OTHER PUBLICATIONS

Matsumoto, "Chemical Vapor deposition of diamond in RF glow discharge", J. Material Science Letters 4, 1985, pp. 600–602.

*Primary Examiner*—Charles T. Jordan
*Assistant Examiner*—Meena Chelliah
*Attorney, Agent, or Firm*—Stephen J. Church; Melvin J. Sliwka

[57] ABSTRACT

In depositing an adhering, continuous, polycrystalline diamond film on a substrate by forming a refractory nitride interlayer on the substrate and depositing diamond on the interlayer in a vacuum chamber containing a microwave activated mixture of hydrogen and a gas including carbon, the crystal orientation of the deposited diamond, <111> or <100>, is selected by controlling the pressure in the chamber. Preferably, relatively higher microwave power is utilized at higher pressures.

10 Claims, No Drawings

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SELECTION OF CRYSTAL ORIENTATION IN DIAMOND FILM CHEMICAL VAPOR DEPOSITION

CROSS REFERENCE TO RELATED APPLICATION

This application is a substitute for U.S. patent application Ser. No. 07/702,207 which was filed May 16, 1991 and which is now abandoned, on Aug. 13, 1995.

BACKGROUND OF THE INVENTION

1. Field of the Invention

The present invention pertains to coating processes using vapor deposition of coatings including diamond.

2. Description of the Prior Art

The carbon allotrope diamond has many potential uses. Diamond has extreme hardness, resistance to thermal and mechanical shock, and transparency to a wide range of electromagnetic wavelengths from ultraviolet through visible and infrared radiation to microwaves. Diamond would thus be an unexcelled coating for transmitting, reflecting, and absorbing optical and microwave elements subjected to weather, particulate erosion, and high energy radiation. Diamond also has high thermal conductivity and high electrical resistivity when pure. Diamond would thus make integrated circuits and other electrical and electronic devices incorporating a diamond film unexcelled for operation at high temperature, for convenience of cooling, and where transparency, environmental resistance, and radiation resistance are desirable.

The chemical vapor deposition (CVD) of a film of polycrystalline diamond from an activated gaseous mixture which includes a gas containing carbon is well-known and would appear to make these potential uses practical. However, diamond films deposited heretofore by CVD on a non-diamond substrate do not adhere thereto sufficiently for practical purposes unless the substrate is first abraded, as with diamond grit, or seeded with diamond particles, as by such abrasion leaving diamond particles. As a result of the abrasion and/or seed particles, the substrate is irregular and the crystallites forming the deposited film are irregular in size and spacing, very defected, and without preferred crystal orientation. The substrate and diamond film of the prior art are thus too irregular for use as an optical coating although continuous and smooth polycrystalline films are well-suited as optical coatings.

Although prior art CVD diamond may be usable as a relatively massive heat sink, prior art CVD diamond is too irregular for use in an electronic device for doping as an active element of a transistor or the like or for use as an electrical insulating or thermal conducting layer within an integrated circuit.

The irregularities of prior art CVD diamond films may be disadvantageous for mechanical protection even where optical and electrical properties are irrelevant. For example, a very thick diamond layer may be rapidly deposited using a plasma torch or jet in which the carbon containing gas, which may be a portion of a flame, is activated by discharging the gas through an electric arc. However, the resulting diamond layer is so irregular and the crystallites so imperfectly joined that the layer has, despite its thickness, relatively poor resistance to weathering.

The deposition, in a chamber containing gas at a pressure less than atmospheric, of a film or layer of a material onto a substrate is, of course, well-known. Such vacuum deposition may be carried out by sputtering where ions of a gas, typically argon heated by microwave energy, eject atoms to be deposited from a target of the material so that the freed atoms travel to an adjacent substrate and are deposited thereon. Movement of such freed atoms to the substrate may be motivated by a suitable electric potential between the target and substrate. An oxide or nitride of the target material may be deposited by including, respectively, oxygen or nitrogen in the gas in the chamber. Suitable materials, structures, temperatures, and pressures for sputtering deposition of oxides and nitrides of a variety of elements on a variety of substrate materials are readily available for selection by one skilled in the art of vacuum deposition.

In chemical vapor deposition, atoms to be deposited on a substrate are provided as atoms in molecules of a gas present in the chamber and activated while in contact with the substrate. Typically, the gas is activated by heating the gas by microwave energy, a hot filament, electric discharge, or combustion so that the gas releases free radicals containing the atoms to be deposited on the substrate. Typically in CVD, no electric potential relative to the substrate is provided, and the substrate is maintained at a suitable temperature by electrical resistance or induction heating.

In deposition of diamond by CVD, a gas containing the carbon which forms the diamond is provided as small proportion of a gaseous mixture in the chamber, the balance of the gas being predominantly hydrogen. Such a mixture may be activated by microwave energy at a frequency which excites the hydrogen molecule. The carbon containing gas is usually methane which is readily obtained in a pure state and is present in the mixture at a proportion less that 5% and, typically, 0.5% to 2%. However, the necessary carbon-containing free radicals may be obtained from vapors of other hydrocarbons, alcohols, or the like. It is known in diamond CVD to add a small amount of oxygen to the mixture of hydrogen and carbon containing gas, the proportion of oxygen being substantially less than that of methane. The oxygen serves to increase the rate and quality of diamond deposition by oxidizing graphite which, depending on the deposition conditions, may be deposited along with the diamond.

Diamond may be deposited by CVD over a wide range of conditions. The vacuum chamber may be maintained at a pressure of 0.1 to 100 Torr by pumping while providing new gaseous mixture. The substrate is maintained at 550° to 1100° C. In general higher pressures increase the rate of diamond deposition as do higher substrate temperatures up to 900° or 1000° C. In prior art diamond CVD, variations in substrate temperature, in gas activation method and temperature, in the proportion of carbon providing gas, and in the method of substrate abrasion provide some control over the crystal size and the irregularity of the deposited diamond. However, in all prior art diamond CVD the deposited polycrystalline diamond is, as before stated, irregular and without a preferred crystal orientation.

The extreme hardness of diamond, while highly desirable in protective optical coatings and the like, is disadvantageous in that polishing of such a coating, as required for optical and other applications, is difficult. It is known that the <111> crystal orientation of diamond, which corresponds to a triangular face of a diamond crystal is somewhat less hard than the <100> crystal orientation corresponding to a square face of a diamond crystal. It would therefore, be highly desirable to selectively deposit diamond film with a preferred orientation so that the <111> orientation, which is sufficiently hard for most protective purposes, may be preferentially deposited for ease in polishing or the like or the <100> orientation may be preferentially deposited where extreme hardness is desired. However, heretofore there has been no way of providing diamond of a selected crystal orientation since crystallites of diamond deposited by prior art CVD methods are, like crystals of natural diamond and other synthetic diamond, a mixture of these orientations.

SUMMARY AND OBJECTS OF THE INVENTION

In a method of forming an adhering, continuous diamond film of optical or semiconductor quality on a substrate, the film is deposited as a layer of polycrystalline diamond on a refractory nitride interlayer from a gaseous mixture of hydrogen and a gas, such as methane, containing carbon, the substrate and the interlayer being heated and the gaseous mixture being activated by microwave energy. In such a method the crystal orientation of the deposited diamond is selected by controlling the pressure of the mixture and other deposition conditions, a relatively lower pressure and corresponding microwave power resulting in the <100> orientation being preferred and a relatively higher pressure and corresponding power resulting in the <111> orientation being preferred.

It is an object of the present invention to provide a polycrystalline diamond film which is of sufficiently high quality for optical and semiconductor uses and which, selectively, has a preferred <100> or <111> crystal orientation.

Another object is to provide such a high quality diamond film wherein the crystal orientation may be selected for high resistance to environmental effects.

Another object is to provide such a high quality diamond film wherein the crystal orientation may be selected for relative ease in polishing.

DETAILED DESCRIPTION OF THE INVENTION

Apparatus, materials, and operating conditions which are an environment for the present invention are not a part of the invention but are now briefly described. Such apparatus, materials, and conditions are well-known, and a representative such environment is more fully described in U.S. Pat. No. 5,169,676 which issued Dec. 8, 1992 to the present inventors, which is commonly owned, and which is hereby incorporated by reference.

A representative vacuum chamber used in the practice of the present invention admits microwave energy at 2.45 GHz for resonance with hydrogen molecules to form a plasma ball of activated gas above a graphite stage mounting a substrate bearing a nitride interlayer on which diamond is deposited from the activated gas.

Typically, such a chamber has walls constructed of stainless steel and connected to a system ground. One wall has a slot for admission of the microwave energy through a waveguide from a microwave source and power controller which provides a selected level of microwave energy to the waveguide. Since reflected microwave energy from the chamber may be minimized by adjustment. of suitable tuning stubs, this level is substantially that provided to the chamber. A quartz window isolates the chamber interior physically from the microwave supplying elements, but passes microwave energy to form the plasma ball.

The substrate may be heated by induction heating to a selected temperature, and the interlayer surface contacted by the plasma ball and undergoing diamond deposition is viewable through a window by an optical pyrometer for determining the exact temperature of such surface. A thermocouple engages the stage and is connected to an induction heater power source and controller for maintaining the stage at a selected temperature.

A DC power supply is connected so as to provide a selected DC bias voltage in a range of about positive 20 volts to about negative 80 volts between the vacuum chamber wall and the stage so that this bias voltage is substantially that between the substrate and the chamber wall.

The chamber has a ring manifold for distributing feed gas to the chamber interior. The chamber is associated with an ionization gage for precise measurement of the vacuum within the chamber; an exhaust system for maintaining a selected chamber pressure by pumping while feed gas is being provided to the chamber; and a gas supply system connected between the ring manifold and bottles which contain the gases hydrogen, methane, and oxygen used in representative CVD of diamond involving the present invention. The gas supply system is adapted to provide the chamber with a selected flow of any gas or of any predetermined mixture of gases from the bottles by valves and flow meters through which each bottle is connected to the ring manifold. A gas flow controller receives signals from meters and provides signals to the valves so as to maintain the selected gas flow from each bottle.

The exhaust system has a vacuum pump for continuously withdrawn a flow of gas from the vacuum chamber and has an exhaust valve for selectively throttling this flow. A precision manometer measures the vacuum in the chamber, and is connected to an exhaust valve controller is adpated to actuate the exhaust valve in accordance with signals from the precision manometer so as to maintain a selected such vacuum which may be monitored by the ionization gage. When the chamber is in operation, the selected gas or gas mixture enters the chamber at a selected flow rate and participates in the plasma ball while gases resulting from the ball and any other gases are continuously withdrawn by the exhaust system at a rate determined by the exhaust valve. A selected pressure is thus maintained in the chamber for CVD deposition or a related operation.

The present invention is effective when this pressure is below about 100 torr and, typically, in a range of about 20 to about 50 torr. As is well-known in the art of chemical vapor deposition of diamond from a microwave activated gaseous mixture including hydrogen and a gas containing methane, relatively higher microwave powers providing faster rates of diamond deposition are possible and, preferably, are used with the relatively higher pressures in the range.

The nitride interlayer is deposited on a substrate of any suitable material, and the diamond film is deposited directly on the interlayer surface opposite the substrate. The interlayer may be deposited directly on the substrate or may be deposited on an adhesion layer which is directly deposited on the substrate.

The invention involves the discovery by the applicants that on such an interlayer and without either mechanical treatment, such as abrasion with diamond grit, or seeding with diamond particles, a continuous, adhering, polycrystalline diamond film is depositable on a substrate by CVD from an activated gaseous mixture including hydrogen and a gas providing the carbon for formation of diamond crystallites making up the film. Since such treatment or seeding are not required with the present invention, the smoothness, crystallite regularity, and continuity of the deposited film are not adversely affected by physical irregularities introduced in prior art CVD diamond deposition requiring such treatment and seeding. As a result, a diamond film deposited by CVD in accordance with the present invention may be suited for protective coatings or other uses in optical elements. However, it is believed apparent to one skilled in the art that diamond deposition on such an interlayer may be facilitated by mechanical treatment or seeding so that the resulting diamond film may also be useful where optical quality is not required as in mechanical protection without optical transmission or reflection.

The thermodynamic conditions for CVD deposition of diamond instead of graphite, where the diamond is deposited at a useful rate and with useful purity, require that the surface on which such deposition occurs be at 600° to about 1100° C. since lower temperatures result in substantially no deposition and higher temperatures result in the deposition of graphite only. It is apparent that a nitride used to form the interlayer must be refractory so as to resist these deposition temperatures. The present invention has been effectively practiced with silicon nitride; and it is believed that other refractory nitrides, for example but not limited to, aluminum nitride, boron nitride, hafnium nitride, zirconium nitride, tantalum nitride, niobium nitride, vanadium nitride, and titanium nitride, may be equally effective for the practice of the present invention.

It is also necessary that the refractory nitride be sufficiently thick and regular to allow substantial and regular diamond nucleation. If the nitride interlayer is too thin, it may be so damaged by the highly erosive activated hydrogen of the plasma ball that diamond nucleation does not occur. A nitride interlayer thickness of at least 500 angstrom units has been found satisfactory to resist this activated hydrogen and to allow the interlayer surface to be effectively cleaned by exposure to a plasma ball of substantially pure hydrogen prior to introducing methane to commence diamond deposition. The subject invention is, typically, carried out using a refractory nitride interlayer about 2500 angstrom units in thickness; however, it is believed by the applicants that an adhering layer of refractory nitride material of any practical thickness or bulk nitride material which is suitably structured, regular, and free from interstices so as to allow widespread diamond nucleation may be coated with a diamond film in accordance with the subject invention to provide a preferred <111> or <100> orientation of crystallites forming the film.

A suitable refractory nitride interlayer may be deposited b sputtering; and such an interlayer has been formed of silicon nitride or aluminum nitride deposited by the well-known RF diode sputtering process on a substrate of silicon or silicon carbide. An adhesion layer of silicon dioxide may be formed directly on the substrate in the same RF diode process before deposition of the nitride. The adhesion layer need only have a thickness of about 50 to 100 angstrom units.

Since the thermodynamic conditions for CVD deposition of diamond are the same for the subject invention as in the above discussed prior art deposition of diamond by CVD from a gaseous mixture of hydrogen and a gas, such as methane, containing carbon which forms the diamond, it is believed that, as in the prior art, the present invention may be also be practiced using carbon sources other than methane and may be practiced with any suitable apparatus, amount of microwave power for activation, or other source of activation energy.

It has been found that the above-described use of oxygen in the gaseous mixture when methane is initially introduced may result in such oxidation of the nitride interlayer that no diamond film is deposited thereon. However, the gaseous mixture may be provided without oxygen at the beginning of diamond deposition so that the nitride interlayer is not oxidized, and then, after a sufficient thickness of diamond has been deposited to protect the nitride, introducing oxygen into the mixture to promote faster growth and purity of the diamond subsequently deposited.

It has been found advantageous while depositing a diamond film such as that of the present invention to provide a bias voltage between the substrate and the vacuum chamber walls. Under typical conditions for effective diamond film deposition giving the substrate a bias of about 20 volts positive in relation to the wall has been found to promote more rapid growth of smaller and more regular crystallites.

It is apparent that the principles of the subject invention may be employed for deposition of a protective or other diamond coating on zinc sulfide, which sublimes at about 800° C., by sputtering a nitride interlayer on a substrate of zinc sulfides under well-known conditions which avoid damage to the zinc sulfide substrate, and then and in accordance with the present invention, depositing a diamond layer on the interlayer using temperature in the range of about 600° to about 800° C. which will not result in damage to the zinc sulfide substrate.

Therefore, it is believed apparent that the subject invention in its broadest aspect involves the deposition of diamond by CVD on any nitride material sufficiently refractory to withstand the temperature at which deposition occurs and sufficiently uniform for widespread nucleation of diamond crystallites and that deposition may be facilitated by mechanical treatment or seeding of the interlayer before diamond deposition where the resulting diamond film need not be optically perfect.

Although the present invention is effective in the production of a layered structure—such as an optical element having a polycrystalline diamond film deposited directly on a refractory nitride interlayer which is deposited on a substrate such as zinc sulfide—it will be apparent to one skilled in the art that the invention is not limited to an optical element. It will also be apparent that in an article of manufacture having a diamond layer deposited in accordance with a method embodying the present invention, the diamond layer may itself have subsequently deposited thereon an additional layer or coating; that a substrate may itself be deposited on a base substrate; and that, after deposition of the diamond layer, any or all of the interlayers and substrate may be removed, as by etching, leaving the diamond layer and any unremoved interlayer.

Specifically, the present invention is an improvement in a method for CVD deposition of diamond crystallites directly on a surface to form a continuous, adhering, polycrystalline film of the crystallites where the surface is a refractory nitride material and the crystallites are deposited from an activated gaseous mixture including hydrogen and a gaseous compound, such as methane, providing the carbon from which the crystallites are formed. The improvement is characterized by controlling the pressure of such gaseous mixture during such deposition so as to select the preferred crystal orientation, <100> or <111>, of the crystallites.

More specifically and when the crystallites are deposited as set forth in the immediately preceding paragraph, the present invention involves maintaining the pressure of such gaseous mixture at least than about 30 torr so that the <100> orientation is preferred or maintaining the pressure of such gaseous mixture at more than about 30 torr so that the <111> orientation is preferred.

For the purposes pf the present invention, a crystal orientation in the <100> or <111> direction is "preferred" if more than 50% of the deposited crystallites have that orientation as determined by scanning electron microscopy, Normarski micrographs, or any other suitable method. However, the proportion of the crystallites having the orientation selected in accordance with the present invention may be substantially higher than 50%.

EXAMPLES

The following examples and prior to chemical vapor deposition (CVD) of diamond in accordance with the subject invention, substrates and interlayers were provided by well-known techniques as follows:

silicon was provided as 99.999% purity targets for sputtering and a single crystal wafers for substrates;

silicon dioxide adhesion layers were deposited by RF diode sputtering from a silicon target in an argon and oxygen mixture to a thickness in the range of 50–100 angstrom units; and silicon nitride was deposited by RF diode sputtering from a silicon target in an argon and nitrogen oxygen mixture to a thickness of 2500 angstrom units;

In the following examples, deposition of diamond by CVD in accordance with the subject invention was carried out in a 1.5 kw microwave reactor system including a vacuum chamber, microwave generator, and induction substrate heating. This system, a high pressure microwave system of well-known construction made by Applied Science and Technology Inc. of Cambridge, Mass., corresponds to that described above and in the above-referenced U.S. Pat. No. 5,169,676. An electrical bias was provided for the substrate by a conventional DC power supply. The vacuum pumping system was capable of providing a vacuum of $10^{-4}$ torr and the vacuum was monitored and controlled by a capacitance manometer. The manometer was calibrated by a an ionization gauge. Hydrogen, methane, and oxygen were provided to the reactor system by a computer controlled and mass flow monitored system. The substrate temperature was monitored and controlled by a thermocouple received in a graphite stage mounting. The substrate, and the exact substrate temperature was determined by an optical pyrometer viewing the substrate through a window of the chamber.

The substrate bias was the direct current voltage of the substrate relative to the chamber wall.

Neither the substrate, the silicon dioxide adhesion layer, nor the nitride layer were abraded with diamond or other grit or seeded with diamond.

The deposited diamond was examined for film uniformity, crystallite size, and crystal orientation by a scanning electron microscope.

EXAMPLE I

A substrate coated by RF diode sputtering with a silicon dioxide adhesion layer and then with a silicon nitride layer was utilized. The substrate was brought to 850° C. and the chamber vacuum pumped for 20 minutes. Hydrogen flow was then started, the chamber pressure set to 25 torr, and microwave power turned on to initiate the plasma ball. The hydrogen flow was then set to 186.3 sccm, the chamber pressure was set to 45 torr, the 3 microwave input power adjusted to 900 watts which corresponds to the 45 torr pressure, and the microwave tuning stubs adjusted to minimize reflected microwave power. For cleaning, the silicon nitride layer was then etched for 5 minutes in the hydrogen plasma. The substrate bias was turned on and set to a positive 20 volts. Methane flow as then started and set to 4.2 sccm and the deposition continued for 2 hours. Oxygen flow was then started and set to 0.85 sccm, and the deposition continued for 8 additional hours.

The deposited diamond was examined and found to be deposited in a continuous film about 5 micrometers in thickness so that the film growth rate was about 0.5 micrometers per hour. The film was formed of crystallites averaging 0.5 to 1.0 micron in diameter. The crystsallites were preferentially ordered in the <111> plane.

EXAMPLE II

Example II was carried out substantially as in Example I except as follows: First, the chamber pressure was set to 20 torr when hydrogen flow was initiated, and this 20 torr pressure was maintained during diamond film deposition. Second, after initiating the plasma ball, the microwave power was adjusted to 600 watts, and this 600 watt power, which corresponds to the 20 torr pressure, was maintained during diamond film deposition.

The deposited diamond was examined after the total deposition time of 10 hours and found to be deposited in a continuous film about 2.5 micrometers in thickness. The film growth rate was thus about 0.25 micrometers per hour, a slower growth rate than in Example I and corresponding to the lower pressure of 20 torr. The film was formed of crystallites averaging 0.5 to 1.0 micron in diameter. The crystallites were preferentially ordered in the <100> plane.

When these examples and the foregoing description are considered, it is evident that many modifications and variations are possible in light of the teachings therein. It is, therefore, to be understood that within the scope of the appended claims the invention may be practiced other than as specifically set forth above.

What is claimed is:

1. A method for forming diamond crystallites, the method comprising:

providing a refractory nitride material having a surface;

depositing said diamond directly on said surface by chemical vapor deposition from an activated gaseous mixture including hydrogen and a gas containing carbon; and controlling the pressure of said gaseous mixture during said vapor deposition so that said crystallites have preferred crystal orientation.

2. The method of claim 1 wherein said pressure is less than about 30 torr so that said orientation is the <100> crystal orientation.

3. The method of claim 1 wherein said pressure is greater than about 30 torr so that said orientation is the <111> crystal orientation.

4. The method of claim 1 wherein said nitride has a thickness of at least 500 angstrom units and wherein the method further comprises activating said mixture by microwave energy while maintaining said surface at a temperature in the range of about 600 to about 1100 degrees centigrade and maintaining said pressure below about 100 torr.

5. The method of claim 4 wherein said pressure is less than 30 torr so that said orientation is the <100> crystal orientation.

6. The method of claim 4 wherein said pressure is greater than 30 torr so that said orientation is the <111> crystal orientation.

7. In a method for depositing a film of diamond crystallites on a substrate from an activated gas providing carbon from which said crystallites are formed, an improvement for depositing said crystallites with a predetermined crystal orientation wherein the improvement comprises selecting the pressure of said gas so as to determine said crystal orientation.

8. The method of claim 7 wherein said crystallites are deposited on a refractory nitride material.

9. The improvement of claim 8:

wherein in said method, said gas consists of hydrogen and a compound including said carbon, and said substrate is maintained at a temperature in a range of 600 degrees to 1100 degrees centigrade; and wherein said improvement further comprises selecting said pressure below about 30 torr so as to preferentially deposit said crystallites having the <100> orientation.

10. The improvement of claim 8:

wherein in said method, said gas consists of hydrogen and a compound including said carbon, and said substrate is maintained at a temperature in a range of 600 degrees to 1100 degrees centigrade; and wherein said improvement further comprises selecting said pressure above about 30 torr so as to preferentially deposit said crystallites having the <111> orientation.

* * * * *